United States Patent [19]

Yamaguchi et al.

[11] Patent Number: 4,774,454
[45] Date of Patent: Sep. 27, 1988

[54] DISTORTION MEASURING SYSTEM METHOD UTILIZING SIGNAL SUPPRESSION

[75] Inventors: Takahiro Yamaguchi, Kumagaya; Hiromi Kosawa; Masayuki Ogawa, both of Gyoda; Toshiharu Kasahara, Okegawa, all of Japan

[73] Assignee: Advantest Corporation, Gyoda, Japan

[21] Appl. No.: 82,231

[22] Filed: Aug. 6, 1987

[30] Foreign Application Priority Data

Aug. 6, 1986 [JP] Japan ................. 61-184519

[51] Int. Cl.⁴ .......................................... G01R 23/20
[52] U.S. Cl. ........................... 324/57 DE; 324/77 A
[58] Field of Search ............. 324/57 R, 57 DE, 77 B, 324/77 N, 57 N; 364/485, 487; 455/67, 115

[56] References Cited

U.S. PATENT DOCUMENTS 4,067,060  1/1978  Poussart et al. ................. 324/77 B
4,287,469  9/1981  Harzer .............................. 324/57 R Primary Examiner—Reinhard J. Eisenzopf
Assistant Examiner—Anthony L. Miele
Attorney, Agent, or Firm—Staas & Halsey

[57] ABSTRACT

A method for testing and measuring distortion in electrical devices is provided. For signal processing and carrying devices, a signal generator generates a signal having known phase, amplitude and frequency, which is provided both to a device under test and a measuring unit. The measuring unit measures the amplitude, frequency and phase rotation of an output of the device under test and provides these measured values to a suppression signal generator. The suppression signal generator generates a suppression signal which is added to the output signal from the device under test for suppressing the fundamental wave of the output signal. This suppressed signal is then provided to the measuring unit, for comparison with the original output signal from the device under test for determining distortion factors. For testing signal reproducing devices, such as compact disc players and video tape recorders, such a device reproduces a series of signals, for which a series of corresponding suppression signals is generated by the suppression signal generator. Each suppression signal is added to the corresponding original signal and eliminates the fundamental wave in each signal in the series. The suppressed signals are then compared with the orginal corresponding signals for determining distortion factors of the signal reproducing device.

11 Claims, 6 Drawing Sheets

DISTORTION MEASURING SYSTEM METHOD UTILIZING SIGNAL SUPPRESSION

BACKGROUND OF THE INVENTION

This invention relates to a signal suppression system which is used, accompanied by spectrum analyzers, for measuring distortion factors of electronic components such as amplifiers, filters, and signal transmission lines, or signal reproduction devices, such as compact disc players or video tape recorders.

A spectrum analyzer is utilized in order to analyze the frequency of signals. The spectrum analyzer can measure distortion factors of higher order frequency elements by comparing them with a fundamental wave.

Also, by using a two input type spectrum analyzer, a comparison between a stimulus, which is provided to a device under test (DUT), and its response output is available. In addition, by analyzing correlations between the stimulus signal and the response signal, response characteristics of the DUT, that is, a transfer function, will be determined.

Due to the improvement of microcomputers, a digital spectrum analyzer which internalizes a FFT (Fast Fourier Transformation) or a DFT (Discrete Fourier Transformation) and various kinds of signal processing functions, has been developed. Through the use of this digital spectrum analyzer, frequency analysis, distortion factor measurements and transfer function measurements are easily, automatically and accurately accomplished.

In taking measurements of this kind, a signal generator is used as a stimulus. This signal generator is generally composed of a ROM, in which various waveform data are stored, and means for reading out data from the ROM. By reading out desired waveform data from the ROM with a desired speed, signals having expected waveforms and frequencies are available.

Therefore, as shown in FIG. 1, a signal generator 1 outputs a stimulus signal 2 which satifies frequency, waveform and other requirements, and provides the signal 2 to a DUT 3. A two-input spectrum analyzer 4 receives two signals; the signal 2, which is also being supplied to the DUT 3, and a response signal 5, which is outputted from the DUT 3. The spectrum analyzer frequency analyzes both signals to indicate a frequency spectrum, which is displayed on a display 4A. In addition, the spectrum analyzer 4 can, for example, obtain an amplitude ratio and a phase difference between a fundamental wave in the stimulus signal 2 and the response signal 5 and an amplitude ratio of the fundamental wave of the stimulus signal 2 and harmonic waves of the response signal 5. From the results of the above frequency analysis the spectrum analyzer can also obtain transfer functions and distortion factors of the DUT 3.

In order to measure, for example, distortion factors of the DUT 3, a sine wave which has an extermely small distortion ratio is applied to the DUT 3. Then, the ratios of the resulting fundamental element and harmonic elements are obtained. The DUT 3 can be an audio amplifier or a speaker or a video amplifier, and these products have extremely small distortion. When the distortion factor of the DUT 3 is small, the output level of the harmonic wave elements will also be small. However, if a fundamental wave level is large, accurately measuring the level of the harmonic wave elements becomes very difficult and costly, since very wide measuring of the dynamic range is required.

In order to solve the above-described problems, a high pass filter can be employed at the output of the DUT 3 to remove the fundamental wave. However, if a filter is inserted in series with the DUT 3, the true distortion factor will not be calculated. This is because the amplitude and phase characteristics of the filter are added to the amplitude and phase characteristics of the resulting signal from the DUT 3.

SUMMARY OF THE INVENTION

An object of the present invention is to provide a distortion measuring system utilizing signal suppression that is capable of producing a signal of opposite phase to a fundamental wave which is included in a response signal of a DUT, and suppressing the fundamental wave by adding this opposite phase signal to the response signal, thereby allowing accurate measurement of desired signal characteristics.

It is a further object to provide a signal suppression system which is capable of suppressing signals from devices which process or carry signals for allowing measurement of distortion factors from the device.

It is also an object of the present invention to supply signal suppression in the distortion measuring system for testing signal reproducing devices.

According to the present invention, a signal from a signal generator is supplied to a DUT, and this input signal and the resulting response output signal from the DUT are supplied to a measuring unit. The measuring unit, which can be, for example, a spectrum analyzer, obtains phase rotation of the DUT by measuring the phase difference between the input signal and the response signal, and also measures the fundamental amplitude of the response signal.

The phase rotation and amplitude data are provided to a suppression signal generator, which generates a suppression signal having exactly the same frequency and amplitude but opposite phase, which means a 180° difference in phase, to the fundamental wave of the response output signal from the DUT.

The suppression signal and the response output signal are combined by an adder so that the fundamental wave is suppressed. Therefore, only the harmonic waves are provided to the measuring unit. Thus, even though the amplitude ratios of the fundamental wave and harmonic wave are large, distortion can be measured accurately by a measuring unit having a relatively small dynamic range.

In the case where a measuring unit has only one input terminal, and thus phase rotation measurement by comparison is not possible by the measuring unit, at first, a suppression signal of known phase having the same frequency and amplitude as the fundamental wave is added to the DUT output signal. Then, based on the phase angle remaining in the signal resulting from the adding process, phase rotation in the DUT is calculated. By setting phase data thus calculated in the suppression signal generator, suppression signals having a phase difference of 180° from the input signal can be generated and thus the fundamental wave of the DUT response signal is completely cancelled.

With this signal suppression system, intermodulation measurement is also possible where two input signals which have frequencies close to each other are provided to the DUT in order to obtain ratios of the harmonic wave elements and the fundamental wave which will be generated at the DUT output.

In addition, distortion factor and other measurements can be carried out in a short time, since suppression signals can be generated automatically by computing various conditions based on the measured data.

These together with other objects and advantages of the invention will become more apparent from the following descriptions, reference being had to the accompanying drawings wherein like reference numerals designate the same or similar part throughout.

DESCRIPTION OF THE PREFERRED EMBODIMENTS

Figure 2:
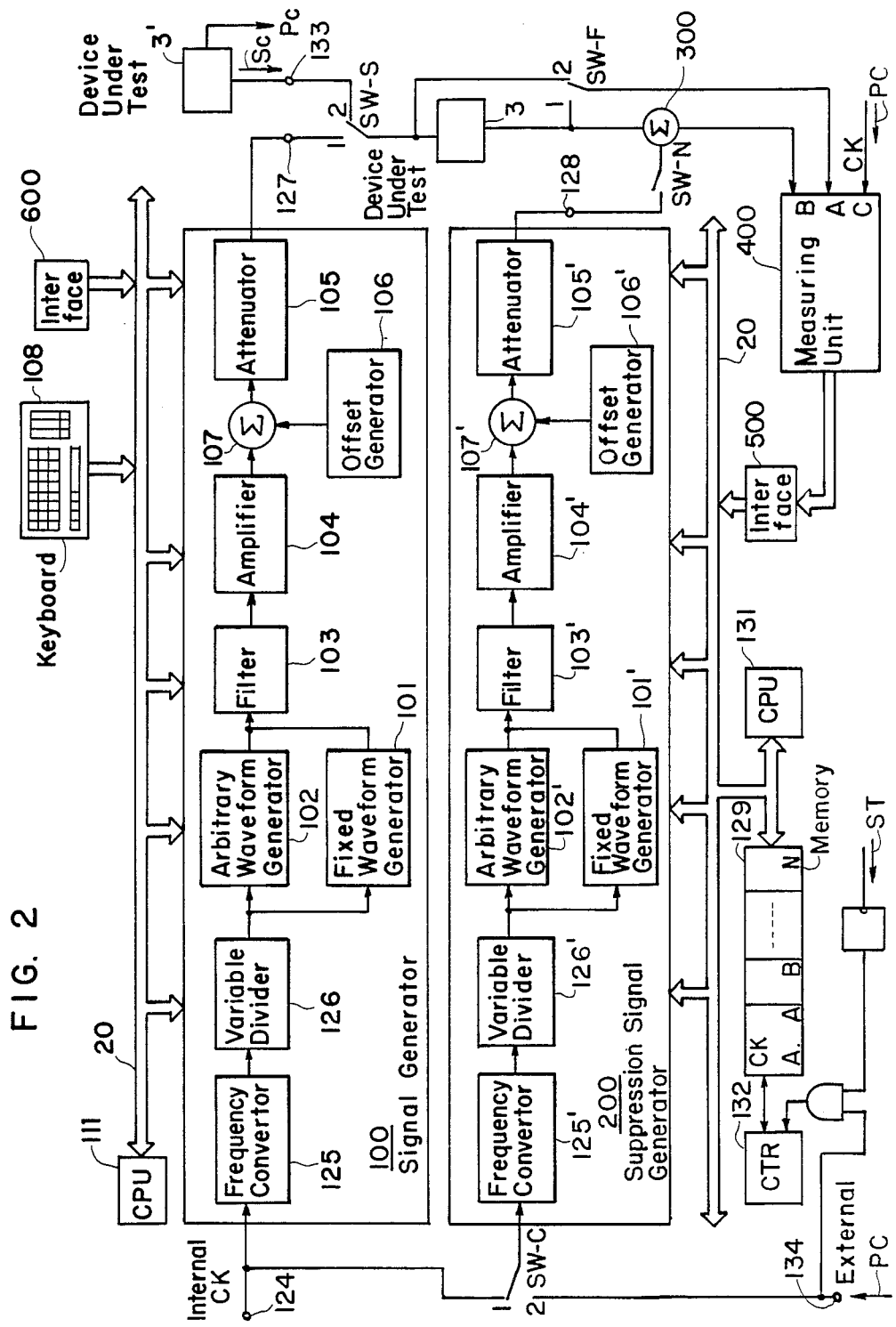
FIG. 2 is a block diagram of one embodiment of the present invention.

FIG. 2 is a block diagram of one embodiment of the present invention. Element 100 indicates a signal generator, element 3 is a device under test (DUT), element 200 is a suppression signal generator, element 300 is an adder, and element 400 is a measuring unit.

The signal generator 100 is composed of a fixed waveform generator 101 which outputs recorded waveform data, and arbitrary waveform generator 102 which writes-in and outputs arbitrary waveform data, a low-pass filter 103 which is provided with signals from the fixed waveform generator 101 or the arbitrary waveform generator 102, an amplifier 104 which amplifies output signals of the low-pass filter 103 to the required level, and a variable attenuator 105 which attenuates signals to the desired level. Also, element 106 indicates a DC offset generator which can provide direct current offset voltage depending upon the need. The offset voltage is overlapped with the output signals from the amplifier 104 by an adding circuit 107.

Figure 3A:
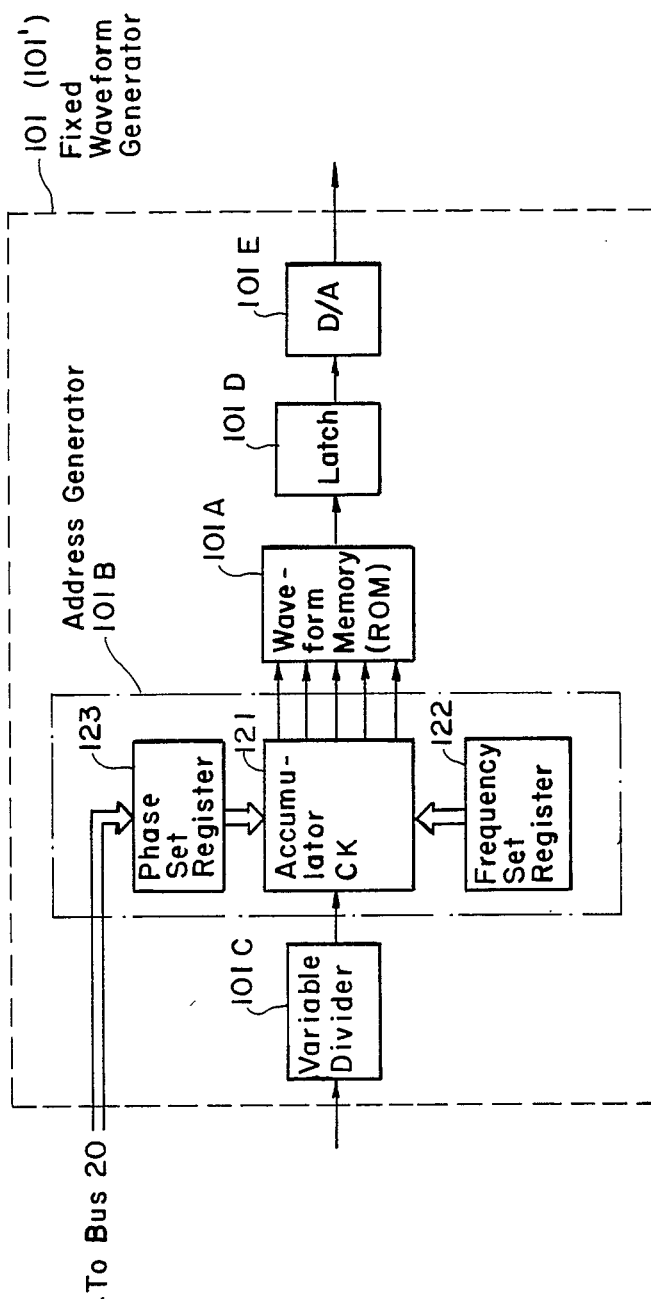
FIG. 3A is a block diagram of the fixed waveform generator 101 or 101' of FIG. 2.

As illustrated in FIG. 3A, the fixed waveform generator 101 is composed of a waveform memory 101A having a built-in ROM, and address generator 101B, a variable divider 101C, a latch circuit 101D, and a digital-to-analog (D/A) convertor 101E. The address generator 101B is capable of controlling the read out speed and initial address, which determine frequency and an initial phase of the output signal. The latch circuit 101D holds the waveform data from the waveform memory 101A in each cycle and provides it to the D/A convertor 101E. The waveform memory 101A is divided into several memory blocks, each of which stores various waveform data, such as sine waves and/or triangular waves. Therefore, by designating a desired memory block of the memory 101A through a keyboard 108 and a microcomputer 111, fixed waveform data in waveform memory 101A can be arbitrarily read out.

As illustrated in FIG. 3A, the address generator 101B is composed, for example, of an accumulator 121, a frequency set register 122, and a phase set register 123. A clock pulse from the variable divider 101C is provided to a clock terminal CK of the accumulator 121. The accumulator 121 cumulatively adds data from the frequency set register 122 in every clock pulse and provides this added data to the waveform memory 101A as an address signal. That is, when data "1" is set to the frequency set register 122, an outputted address signal of the accumulator 121 will increment +1 in every clock pulse. The memory 101A stores one cycle of the desired waveform data and generates a continuous signal of a constant frequency by repeatedly reading out the data at a constant speed.

In contrast, an address signal of the accumulator 121 is incremented by +2 when "2" is set in the frequency set register 122. Comparing this to the previous example where the address signal varied by +1, in this case waveform data is read out two times faster, and therefore, two cycles of the desired waveform data will be read out instead of one. That is, the waveform frequency f, which is read out from the memory 101A, varies by (n×f) where n indicates stored data of the frequency set register 122.

The phase set register 123 provides initial address data to the accumulator 121 so that the waveform memory 101A is accessed beginning with the initial address. Therefore, by setting the initial phase, for example, the address corresponding to 90° of waveform data, to the phase setting device 123, the accumulator 121 generates an address signal which starts from 90°.

As described above, the address generator 101B is constructed so that the frequency and phase of read out waveform data of the memory 101A are set freely. The variable divider 101C is used for changing the read out speed of the memory 101A widely so as to be able to change signal frequencies through a wide range.

The structure of the arbitrary waveform generator 102 is similar to the fixed waveform generator 101, the difference being that the arbitrary waveform generator 102 includes a random access memory (RAM) rather than ROM. The arbitrary waveform generator 102 can write-in and read out any desired waveform data from outside freely. Therefore, it is used for generating arbitrary waveforms. This is not directly related to the present invention, but may provide greater flexibility in actual systems.

The fundamental clock, which is also used as a sampling clock for the measuring unit 400, is provided to terminal 124 and supplied to a frequency converter 125. The clock pulse is supplied to the fixed waveform generator 101 and the arbitrary waveform generator 102 through the frequency convertor 125 and the variable divider 126. The frequency converter 125, which is composed of a phase locked loop (PLL), converts the input clock signals into higher frequency signals, which helps in generating precise waveforms since the address signal steps become small.

The waveform data read out from the waveform memories 101A and 102A are maintained in latch circuits 101D and 102D respectively in every clock pulse. Each latched output is provided to the D/A convertor 101E or 102E, where they are converted to analog signals and supplied to the low-pass filter 103. The analog signals that pass through the low-pass filter 103 are amplified or attenuated to a desired level by the amplifier 104 or the variable attenuator 105 and provided to an output terminal 127.

Figure 3B:
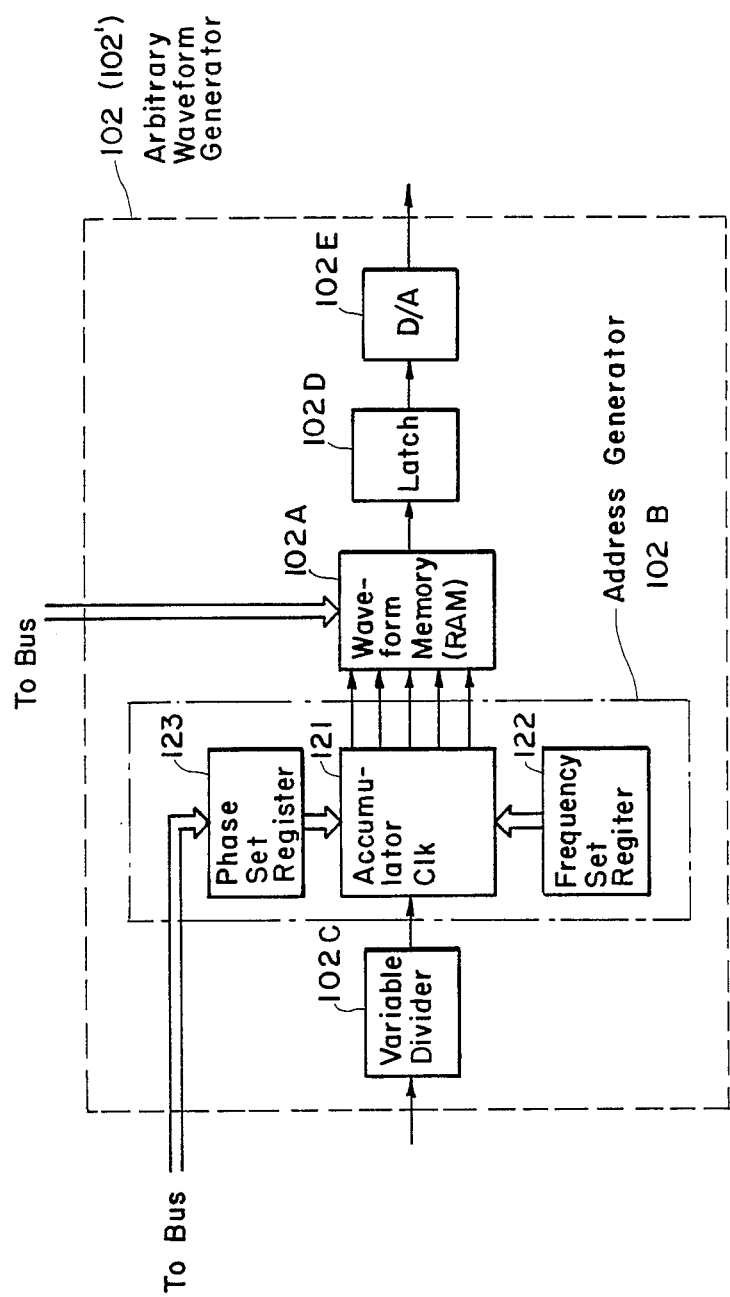
FIG. 3B is a block diagram of the arbitrary waveform generator 102 or 102' of FIG. 2.

The analog signal from the output terminal 127 is supplied to the DUT 3 and to a switch SW-F through a switch SW-S. The switch SW-F provides either one of the input signal for the DUT 3 or output signal of the DUT 3 to input A of the mesuring unit 400. The output signal of the DUT 3 is also provided to input B of the measuring unit 400 through an adder 300. The output terminal 128 of the suppression signal generator 200 is connected to the other input terminal of the adder 300 through a switch SW-N. This suppression signal generator 200 has a configuration identical to the signal generator 100, as is indicated in FIGS. 2, 3A and 3B, and both generators 100, 200 commonly utilize the keyboard 108 and the CPU 111 via the system bus 20.

The suppression signal generator 200 is connected with a condition memory 129 which is used for testing signal reproducible devices illustrated as the DUT 3'. The condition memory 129 stores conditions of signals produced by signal reproducible devices, for example, compact disc and video tape recorders (VTRs). This memory 129 may be composed of an internal RAM in a microcomputer 131 or a separate memory associated with a CPU 131, and stores various conditions for use in generating suppression signals in storage areas A to N. A clock counter 132 begins counting clock signals after a start signal ST is supplied from the CPU 131 or through the bus 20 from the keyboard or from an independent external start or another known method. This clock counter 132 reads out condition data of regions A,B,C, . . . of the condition memory 129. Then the microcomputer 131 reads in these conditions so that the suppression signal can be changed in real time. Detailed description regarding this operation will be provided later.

The procedure for measuring distortion factors of the DUT 3 is described below. Switches SW-S and SW-F are set to points 1 and 2, respectively, and switch SW-N opens. A sine wave is generated by the fixed waveform generator 101 and is supplied as an input signal to the DUT 3. At the same time, the input signal for the DUT 3 is also provided to input A of the measuring unit 400 via switch SW-F, and an output signal from the DUT 3 is provided to input B of the measuring unit 400.

The measuring unit 400 in this case is a spectrum analyzer having two input terminals for measuring and comparing two signals. It measures amplitude $A_P$ and frequency F of the fundamental wave of the output from the DUT 3. It also measures phase rotation $\theta$ by taking both the input and output signals of the DUT 3 and comparing the phase relationship between the two signals. Namely, this spectrum analyzer is capable of not only spectrum analysis but also network analysis.

The data thus obtained is transferred through an interface 500 to the bus 20 to the microcomputer 131, which controls the suppression signal generator 200. The microcomputer 131 sets gain and attenuation in an amplifier 104' and a variable attenuator 105' of the suppression signal generator 200 respectively, so as to generate a signal having an amplitude $A_P$ from the suppression signal generator 200. In addition, based on phase rotation and frequency F, an address generator 101B' in a fixed waveform generator 101' of the suppression signal generator 200 generates a suppression signal that has the same frequency as the output from the DUT 3 but the opposite phase, that is, $\theta + \pi$ or $\theta - \pi$.

By then closing switch SW-N, the suppression signal is supplied to the adder 300, and as a result, the fundamental wave in the output signal from the DUT 3 is eliminated and only higher order elements are inputted into the measuring unit 400. Therefore, even though the measuring unit 400 has a relatively small dynamic range, accurate distortion factors are obtained since the fundamental wave is not supplied to the input terminal.

Figure 1:
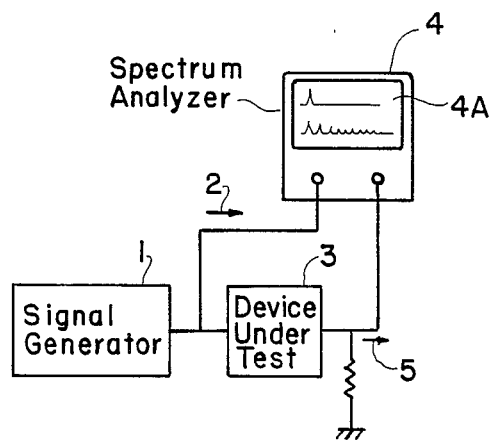
FIG. 1 is a block diagram of a conventional test instrument for measuring distortion factors.
Figure 4:
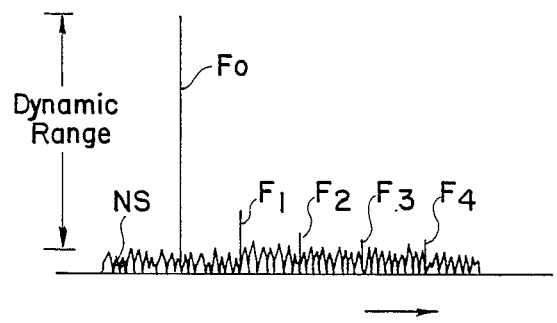
FIG. 4 is a graph for illustrating the problem of measuring spectrums of higher order waveforms when the fundamental wave of an output signal from a DUT is not excluded.
Figure 5:
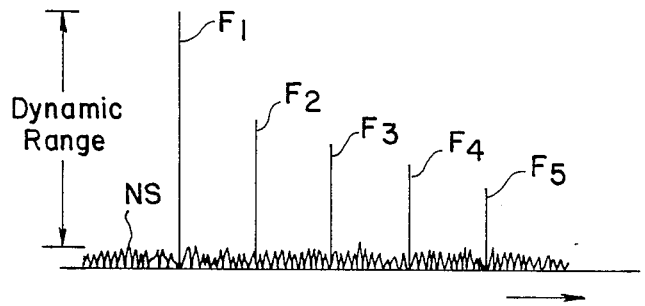
FIG. 5 is a graph for illustrating the measurability of higher order waveforms when the fundamental wave is excluded.

The importance of the elimination of the fundamental wave is shown in FIGS. 4 and 5. In FIG. 4, when a spectrum analyzer frequency analyzes spectrum levels under conditions such that the fundamental wave $F_0$ is included, the levels of higher order waves $F_1$ to $F_4$ cannot be measured accurately. This occurs due to the limited dynamic range of a frequency analyzer. This causes frequencies that have levels lower than the fundamental wave to be bured under noise NS.

On the contrary, when the fundmental wave $F_0$ is excluded, as shown in FIG. 5, higher order waveforms $F_1, F_2, F_3, \ldots$ can be measured within the dynamic range of a waveform analyzer by increasing the analyzer's gain, for example. As a result, those waveforms will be measured accurately without being affected by the noise element NS and without being limited by the peak level of the fundamental wave $F_0$. By connecting switch SW-F to point 1, the output signal of the DUT 3 is supplied to input terminal A of the measuring unit 400, where the level of the fundamental wave $F_0$ is measured. Therefore, by the ratios of $F_0$ to $F_1, F_2, F_3, \ldots$ respectively, precise measurement of distortion factors is accomplished.

Figure 7:
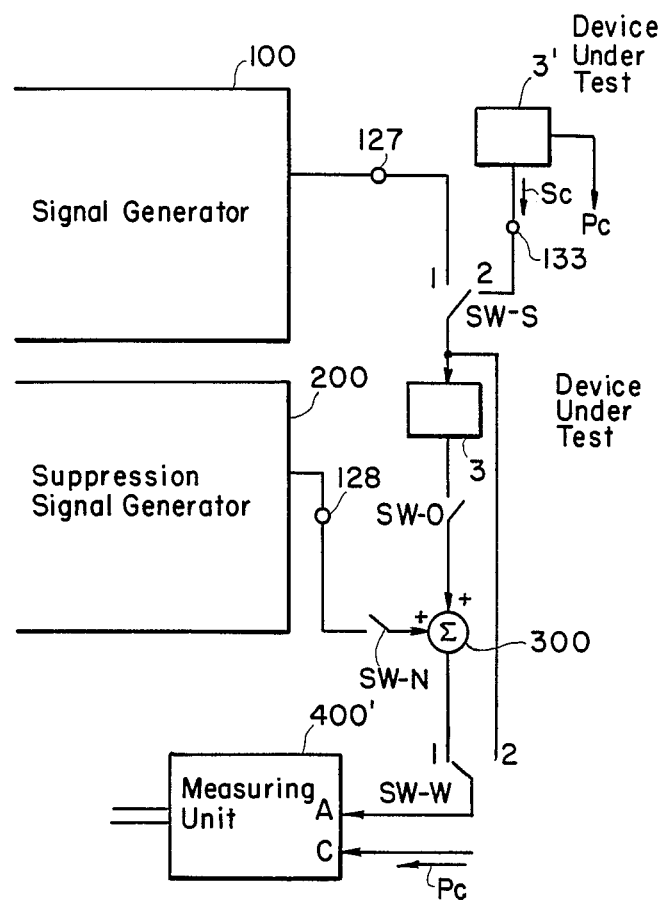
FIG. 7 is a block diagram of the relevant portions of a another embodiment of the present invention wherein the measuring unit has only one test signal input terminal.

In FIG. 7, a measuring unit 400' has one input terminal instead of the two input terminals in FIG. 2. Therefore, the phase difference between input and output signals of the DUT 3 cannot be measured as above. In this case, the suppression signal is generated as follows.

First, switch SW-W is connected to pin 1, as is switch SW-S, and switch SW-O is set to be closed. A sine wave of frequency $F_0$ is supplied to the DUT 3 from the signal generator 100, and fundamental wave amplitude $A_P$ from the output of the DUT 3 is measured by the measuring unit 400'. The suppression signal generator 200 provides a suppression signal having frequency $F_0$ and amplitude $A_P$ and phase difference $\pm \pi$ from the input sine wave. Since the phase rotation caused by the DUT 3 is not taken into account by the suppression signal generator 200 at this stage, the fundamental wave is not completely cancelled. Then, the measuring unit 400' measures the remaining amounts of the fundamental wave derived from the adder 300 so as to calculate phase rotation in the DUT 3.

Figure 8A:
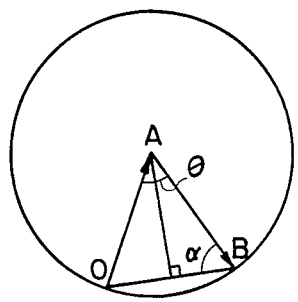
FIGS. 8A and 8B are diagrams illustrtating an example of the procedures for finding phase rotation in a DUT according to the embodiment of FIG. 7.
Figure 8B:
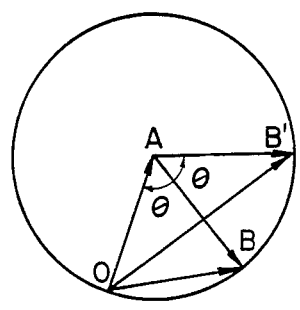

FIGS. 8A and 8B show the phase determining procedure according to this embodiment. Amplitude OA of the fundamental wave of the DUT 3 and amplitude AB of the suppression signal are adjusted to be the same as mentioned above. As illustrated in FIG. 8A, the vector OB is obtained by OB=OA+AB. Vector OB shows the remaining amount of the fundamental wave, and this leads to obtain $\alpha = <ABC$, by $\alpha = \cos^{-1}(OB/2AB)$. This calculation will be executed by, for example, a microprocessor in the measuring unit 400′. Phase data to suppress the fundamental wave is obtained by using this angle $\alpha$. That is, since $\triangle ABC$ is an isosceles triangle, the phase $\theta$ can be calculated by $\theta = \pi = -2\alpha$. By providing and setting this phase data to the suppression signal generator 200, the suppression signal which can cancel the fundamental wave of the DUT 3 output is generated and supplied to the adder 300. Phase rotation can be calculated as above; however, it is not known in which direction it is to be rotated. Namely, the absolute value of phase rotation is obtained by the above procedure, but the polarity of phase is not directly obtained. Therefore, there arises a case where phase $\theta$ is compensated in the wrong direction as shown in FIG. 8B, wherein phase $\theta$ is added in the counterclockwise direction. In this case, it is simply required to reapply the phase data in the opposite direction when the fundamental wave is not sufficiently suppressed by the first application.

Figure 6A:
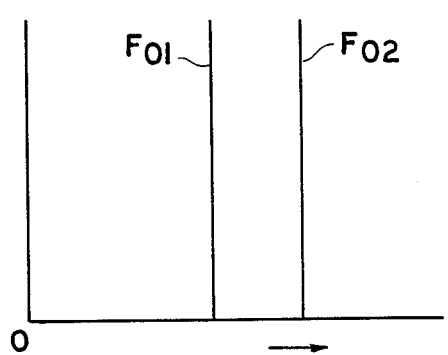
FIG. 6A is a chart illustrating the two generated input signals to be supplied to a DUT for use in measuring intermodulation distortion.
Figure 6B:
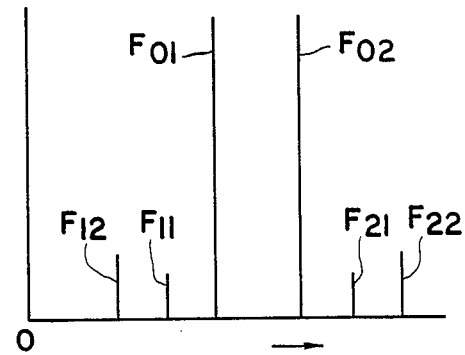
FIG. 6B is a chart illustrating the fundamental waves and sidewaves from the DUT to be used for measuring intermodulation distortion of the DUT.

Further, according to this invention, intermodulation distortion will also be measured. That is, the fixed waveform generator 101 and the arbitrary waveform generator 102 of the signal generator 100 generates two sine waves $F_{01}$ and $F_{02}$, whose frequencies are close to each other. The spectrum levels of these two waves are illustrated in FIG. 6A. When both sine waves are supplied to the DUT 3, sine waves $F_{21}$ and $F_{22}$ are generated. FIG. 6B illustrates the spectrum levels of the four waves. Intermodulation distortion of the DUT 3 can measured by obtaining only the ratio of fundamental wave levels $F_{01}$ and $F_{02}$, and each sine wave $F_{11}$ and $F_{12}$, or $F_{21}$ and $F_{22}$.

Similarly, since the suppression signal generator 200 includes the fixed waveform generator 101′ and the arbitrary waveform generator 102′, it can therefore generate the suppression signals which can eliminate fundamental waveforms $F_{01}$ and $F_{02}$. Thus, levels of side waves $F_{11}$, $F_{12}$, $F_{21}$, and $F_{22}$ as well as intermodulation distortion can be measured accurately by excluding fundamental waveforms $F_{01}$ and $F_{02}$.

Figure 9:
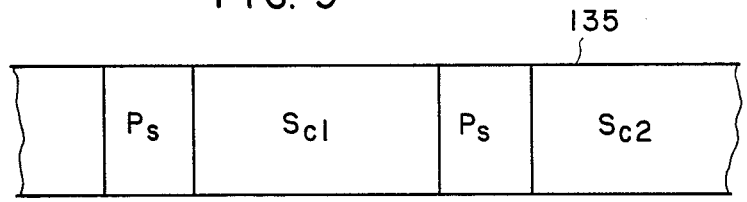
FIG. 9 is a diagram illustrating one example of recording conditions of signals in a recording media.

Distortion factors of the signals from signal reproducing devices such as compact disc players or VTRs, can be measured by utilizing the condition memory 129 as follows. Referring once again to FIG. 2, switch SW-S is connected to point 2 so that reproduced signals $S_c$ from the DUT 3′ are provided to the adder 300. (No DUT 3 is being tested at this time.) The reproduction signal from the DUT 3′ is also supplied to input A of measuring unit 400, as switch SW-F is also connected to its point 2. Then the measuring unit 400 measures frequency F, amplitude A, and phase $\theta$ of the reproduced signal. Phase $\theta$ is an angle of the reproduced signal that corresponds to an amount or clock pulse $P_c$ which is oscillated and outputted from the DUT 3′ together with the reproduction signal $S_c$. A clock pulse $P_c$ outputted from the DUT 3′ is supplied to a terminal 134, passes through switch SW-C and is supplied to the suppression signal generator 200 as a clock pulse. That is, the DUT 3′ is capable of recording and replaying signals which vary in frequency and include synchronous signals. For instance, a compact disc records signals $S_{c1}=31HZ$, $S_{c2}=61HZ$, $S_{c3}=127HZ$, ... and synchronous signals $P_s$ in a storage media 135 simultaneously, as shown in FIG. 9.

After the reproduction of signals, $S_{c1}$, $S_{c2}$, $S_{c3}$, ... and synchronous signal $P_s$, those signals are supplied to input terminal A of the measuring unit 400. In addition, the synchronous signal $P_s$ is supplied to a standard clock generator in a compact disc player 3′ so as to synchronize clock pulse $P_c$ to synchronous signal $P_s$. The clock pulse $P_c$ is supplied to external synchronizing terminal C of measuring unit 400 where signals $S_{c1}$, $S_{c2}$, $S_{c3}$, ... are received in synchronism with the clock pulse $P_c$.

In the first playback operation, frequency F and amplitude A of each of the signals $S_{c1}$, $S_{c2}$, $S_{c3}$, ... are measured. The measured values corresponding to each signal $S_{c1}$, $S_{c2}$, $S_{c3}$, ... are transferred to and stored in the condition memory 129. The condition memory 129 also stores clock numbers $K_1$, $K_2$, $K_3$, ... which slow the timing of change over the signals $S_{c1}$ to $S_{c2}$ to $S_{c3}$ ... respectively. These clock numbers can be obtained by counting the number of clock pulses $P_c$ from the terminal 134 by the counter 132. When the measuring unit 400 detects variation of frequency F of the reproduction signal $S_c$, the microcomputer 131 reads out the counted data in the counter 132. The microcomputer 131 stores the data as, for example, clock number $K_1$ which shows the change over time from signals $S_{c1}$ to $S_{c2}$ in storage region A in the condition memory 129. Therefore, by this procedure, change over positions $K_2$, $K_3$, ..., Kn of signals between $S_{c2}$, $S_{c3}$, $S_{c4}$, ..., $S_{cn}$ are recorded in storage regions B, C, ..., N, respectively.

Following that, the DUT 3′ is set to its initial condition and again reproduces signals $S_{c1}$, $S_{c2}$, $S_{c3}$, ... At this time, switch SW-N closes and supplies signals generated by the suppression signal generator 200 to the adder 300. Consequently, the fundamental waveform will be deleted from the reproduction signal $S_c$.

In other words, while signal $S_{c1}$ is replaying, the microcomputer 131 reads out recorded conditions in region A in the condition memory 129. Those conditions will be applied to each section of frequency, amplitude, and phase setting means of the suppression signal generator 200 to generate a suppression signal having exactly the same amplitude and frequency as signal $S_{c1}$ but the opposite phase. The suppression signal for signal $S_{c1}$ is supplied to the adder 300 at the same time signal $S_{c1}$ reaches the adder 300, in order to exclude the fundamental wave of signal $S_{c1}$. Thereafter, the remaining signal is provided to input terminal B of the measuring unit 400, where it is analyzed.

Therefore, the DUT 3′ reproduces a stored signal, which is then suppressed by a suppression signal supplied by the suppression generator 200 specifically for that signal. The remaining signal is then supplied to input B of the measuring unit 400, and harmonic waves are frequency analyzed and each level of the harmonic waves, for example, second or third harmonic waves, can be measured individually and accurately.

Reproduced signal $S_{c1}$ is directly supplied to input A of the measuring unit 400 through switch SW-F. In this situation, therefore, distortions obtained from the ratio of fundamental wave and harmonic waves are measured. When counted data in the counter 132 reaches clock number K, the microcomputer 131 reads out the conditions corresponding to recorded signals $S_{c2}$ in region B of the condition memory 129 and sets these conditions to fixed units of the suppression signal generator 200. Thus, every time reproduction signals $S_{c1}$, $S_{c2}$, $S_{c3}$, ... from the DUT 3′ are reproduced a second time, suppression signals, which can delete fundamental waves, are generated.

The level of high harmonic waves can be measured accurately without being limited by measuring dynamic range since the measuring unit 400 measures harmonic waves by emphasizing these levels.

The present invention has been described referring to one main embodiment, however, the present invention permits various modificiations within the scope the subject matter of the present invention. Since numerous modifications and changes will readily occur to those skilled in the art, it is not desired to limit the invention to the exact construction and applications shown and described and accordingly, all suitable modifications and equivalents may be resorted to, falling within the scope of the appended claims and their equivalents.

What is claimed is:

1. A method of measuring distortion factors of a device under test, comprising the steps of:
   generating a stimulus signal;
   inputting the stimulus signal to the device under test and a measuring unit;
   supplying a first resulting output signal from the device under test to the measuring unit;
   measuring the amplitude and frequency of the first resulting output signal and the phase difference between the stimulus signal and the resulting output signal to obtain the phase rotation of the device under test;
   generating a suppresssion signal based on the phase rotation, amplitude and frequency measured in said measuring step having opposite phase from the resulting signal;
   adding to the suppression signal to the first resulting output signal to form a second resulting output signal having no fundamental wave;
   inputting the second resulting output signal to the measuring unit; and
   measuring the distortion factors of the device under test by comparing the second resulting output signal to the first resulting output signal.

2. A method of measuring distortion in a signal reproducing device, comprising the steps of:
   reproducing a series of signals from the signal reproducing device representative of data read out by the device;
   measuring the frequency, amplitude and phase angle of each signal in the reproduced series of signals;
   storing the measured values of the frequency, amplitude and phase angle for each said signal in the series of signals;
   initializing the signal reproducing device and reproducing the series of signals stored in the device a second time;
   producing a suppression signal, from the stored measured values, corresponding to each said signal in the series of signals;
   inputting the suppression signals in series to an adder at the same time the corresponding signals in the corresponding series of signals are being inputted to the adder, for suppresssing the fundamental wave of each said signal in the series of signals, producing a series of suppressed signals;
   measuring the distortion of the signal reproducing device by comparing each signal in the series of suppressed signals and the corresponding signal in the series of reproduced signals.

3. A distortion measuring system for measuring distortion factors of a device under test having an input comprising:

a signal generator for generating a stimulus signal, said signal generator having an output connected to the input of the device under test;
   first switching means having a first state for connecting said switching means with an output from the device under test and a second staet for connecting with the output of said signal generator;
   a measuring unit having a first input connected to an output of said first switching means and a second input connected to an output of the device under test, for measuring the frequency and amplitude of an output signal from the device under test and the phase rotation of the device under test;
   a suppression signal generator operatively connected to said measuring unit, said suppression signal generator generating a suppression signal having the same frequency and amplitude as the output signal from the device under test and opposite phase;
   signal adding means coupled between the output of the signal processing device under test and the second input of said measuring unit; and
   second switching means for connecting an output of said suppression signal generator to an input of said signal adding means when closed following the generation of the suppression signal, said second switching means closes, providing the suppression signal to said signal adding means, combining the output signal from said signal processing device with the suppression signal, excluding a fundamental wave in the output signal of said device under test, the resulting suppressed signal being supplied to the second input of said measuring unit, and said first switching means being in the first state, providing the first input of said measuring unit with the output signal from the device under test, wherein said measuring unit compares the resulting suppressed signal and the output signal of the device under test for determining the distortion factors of the device under test.

4. A distortion measuring system according to claim 3, wherein the system is connected to a second device under test having an internal clock, a clock output and an output, the second device under test being a signal reproducing device for reproducing a series of recorded signals, and the device under test having no effect on a signal provided thereto, said system further comprising:
   third switching means having a first state for connecting said signal generator to said device under test and the output of said first switching means and a second state for connecting the second device under test to the device under test and said first switching means, wherein when said third switching means is in said second stae and said first switching means is in said second state, the reproduced series of signals is supplied to the first input of said measuring unit, and said measuring unit measures the frequency amplitude and phase angle of each signal of the series of reproduced signals;
   memory means for sotring frequency and amplitude values corresponding to each said signal in the reproduced series of signals;
   a counter for counting clock pulses indicative of timing changes over the series of signals, wherein each counted number of clock pulses is stored in said memory means;
   a microcomputer for reading out the stored frequency, amplitude, and counted number of clock pulses to said suppression signal geneator for generating a series of suppression signals, wherein after reproducing said series of signals a first time, said second device under test is initialized and reproduces said series of signals a second time, wherein a corresponding suppression signal of the series of suppression signals is applied to said adding means at the same time the reproduced corresponding signal of said series of signals is provided to said adding means, wherein a fundamental wave of each signal in said series of signals is suppressed, and said measuring unit compares the resulting suppressed signal and the corresponding signal of the series of signals for measuring distortion factors of the second device under test.

5. A distortion measuring system according to claim 4, wherein said suppression signal generator includes:
   a frequency converter having an input connected to a clock;
   a variable divider having an input connected to an output of said frequency converter;
   an arbitrary waveform generator operatively connected to said variable divider for generating arbitrarily desired waveforms;
   a fixed waveform generator operatively connected to said variable divider, having a ROM from which fixed waveforms are read out;
   a filter having an input connected to outputs of said arbitrary waveform generator and said fixed waveform generator;
   an amplifier operatively connected to said filter for amplifying a signal from said filter to a desired level;
   a DC offset generator for providing direct current offset voltage;
   an adder for adding output signals from said amplifier and said offset generator; and
   an attenuator connected to an output of said adder for attenuating an output from said adder to a desired level.

6. A system for measuring and testing distortion according to claim 5, wherein said suppresssion signal generator is controlled by a second microcomputer.

7. A distortion measuring and testing system according to claim 6, where instructions for said suppression signal generator are inputted through a keyboard to said second microcomputer.

8. A distortion measuring and testing system for measuring the distortion of a signal processing device under test, said system comprising:
   a measuring unit having a first and input operatively connected to an output of the device under test, wherein said measuring unit measures frequency, amplitude and phase of each reproduced signal, a clock input connected to a clock output of the device under test;
   memory means operatively connected to said measuring unit for storing the measured amplitude, frequency and phase angle data;
   a first processing means operatively connected to said memory means for reading out the stored data from said memory means;
   a signal suppression generator operatively connected to said memory means for receiving said stored data on command of said first processing means for generating a suppression signal for each signal from the device under test;
   signal adding means situated between the output of the device under test and a second input of said measuring unit, said signal adding means also being operatively connected to said supression signal generator, wherein when said device under test reproduces said series of signals a second time, said suppression signal generator generates a suppression signal corresponding to each signal in the series of signals at the same time each said signal is produced by the device under test, causing each said signal to be suppressed by each corresponding suppression signal at said adding means, each said suppression signal being supplied to the second input of said measuring unit for comparison with the corresponding reproduced signal of the series of signals for measuring distortion factors.

9. A distortion measuring and testing system according to claim 8, wherein said suppression signal generator includes:
   a frequency converter having an input connected to a clock;
   a variable divider having an input connected to an outupt of said frequency converter;
   an arbitrary waveform generator operatively connected to said variable divider for generating arbitrarily desired waveforms;
   a fixed waveform generator operatively connected to said variable divider, having a ROM from which fixed waveforms are read out;
   a filter having an input connected to outputs of said arbitrary waveform generator and said fixed waveform generator;
   an amplifier operatively connected to said filter for amplifying a signal from said filter to a desired level;
   a DC offset generator for providing direct current offset voltage;
   an adder for adding output signals from said amplifier and said offset generator; and
   an attenuator connected to an output of said adder for attenuating an output from said adder to a desired level.

10. A system for measuring and testing distortion according to claim 8, wherein said suppression signal generator is controlled by second processing means.

11. A distortion measurig and testing system according to claim 9, where instructions for said suppression signal generator are inputted through a keyboard to said first processing means.

* * * * *